United States Patent
Farooq et al.

(10) Patent No.: US 8,871,636 B2
(45) Date of Patent: Oct. 28, 2014

(54) FLUORINE DEPLETED ADHESION LAYER FOR METAL INTERCONNECT STRUCTURE

(71) Applicant: International Business Machines Corporation, Armonk, NY (US)

(72) Inventors: Mukta G. Farooq, Hopewell Junction, NY (US); Emily R. Kinser, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/047,521

(22) Filed: Oct. 7, 2013

(65) Prior Publication Data
US 2014/0038407 A1   Feb. 6, 2014

Related U.S. Application Data

(60) Continuation of application No. 13/192,120, filed on Jul. 27, 2011, now Pat. No. 8,563,423, which is a division of application No. 12/038,241, filed on Feb. 27, 2008, now Pat. No. 8,039,964.

(51) Int. Cl.
*H01L 21/4763* (2006.01)
*H01L 21/44* (2006.01)

(52) U.S. Cl.
USPC ............ 438/628; 438/644; 438/654; 438/687

(58) Field of Classification Search
USPC ......... 438/618, 622, 626, 628, 644, 654, 666, 438/687, 624
See application file for complete search history.

(56) References Cited

U.S. PATENT DOCUMENTS

| | | | |
|---|---|---|---|
| 5,821,168 A * | 10/1998 | Jain | 438/692 |
| 6,127,256 A | 10/2000 | Matsuno | |
| 6,265,779 B1 | 7/2001 | Grill et al. | |
| 6,284,657 B1 | 9/2001 | Chooi et al. | |
| 6,329,290 B1 * | 12/2001 | Zhao | 438/700 |
| 6,448,655 B1 * | 9/2002 | Babich et al. | 257/759 |
| 6,911,378 B2 | 6/2005 | Conti et al. | |
| 8,563,423 B2 * | 10/2013 | Farooq et al. | 438/628 |
| 2002/0187627 A1 | 12/2002 | Yuang | |

OTHER PUBLICATIONS

Notice of Allowance dated Jan. 29, 2014 from related U.S. Appl. No. 14/047,554.

* cited by examiner

*Primary Examiner* — Hung Vu
(74) *Attorney, Agent, or Firm* — Scully, Scott, Murphy & Presser, P.C.; Katherine S. Brown, Esq.

(57) ABSTRACT

A line trough and a via cavity are formed within a dielectric layer comprising a fluorosilicate glass (FSG) layer. A fluorine depleted adhesion layer is formed within the line trough and the via cavity either by a plasma treatment that removes fluorine from exposed surfaces of the FSG layer, or by deposition of a substantially fluorine-free dielectric layer. Metal is deposited within the line trough and the via cavity to form a metal line and a metal via. The fluorine depleted adhesion layer provides enhanced adhesion to the metal line compared with prior art structures in which a metal line directly contacts a FSG layer. The enhanced adhesion of metal with an underlying dielectric layer provides higher resistance to delamination for a semiconductor package employing lead-free C4 balls on a metal interconnect structure.

11 Claims, 18 Drawing Sheets

FLUORINE DEPLETED ADHESION LAYER FOR METAL INTERCONNECT STRUCTURE

CROSS REFERENCE TO RELATED APPLICATIONS

This application is a continuation of U.S. patent application Ser. No. 13/192,120, filed Jul. 27, 2011, which is a divisional of U.S. patent application Ser. No. 12/038,241, filed Feb. 27, 2008, now U.S. Pat. No. 8,039,964, the entire content and disclosure of each is incorporated herein by reference.

FIELD OF THE INVENTION

The present invention relates to a semiconductor structure, and particularly to a metal interconnect structure employing a fluorine depleted layer for improved adhesion and methods of manufacturing the same.

BACKGROUND OF THE INVENTION

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. One typical packaging technology is Controlled Collapse Chip Connection (C4) packaging, which employs C4 balls each of which contacts a C4 pad on the semiconductor chip and another C4 pad on a packaging substrate. The packaging substrate may then be assembled on the circuit board.

Thus, the packaging substrate facilitates formation of an electrical link between the semiconductor chip and a system board of a computer. A semiconductor chip is mounted on a die foot print area located on a top surface of the packaging substrate. The die foot print area contains C4 pads on which a semiconductor chip may be attached by C4 bonding.

Since lead-free C4 balls are more environmentally friendly than lead based C4 balls, use of lead-free C4 balls in the semiconductor industry has been increasing recently at the expense of lead based C4 balls. Lead-free C4 balls are less malleable than lead-based C4 balls. This has a disadvantageous effect on reliability of a semiconductor package employing lead-free C4 balls. Silicon has a coefficient of thermal expansion of about 3 parts per million (ppm) per degree Celsius, and organic packaging materials have a coefficient of thermal expansion of about 15 ppm per degree Celsius. The differences in the coefficients of thermal expansion induce high shear stress on the C4 balls and the metal interconnect structure therebeneath. Highly malleable C4 balls, such as the lead based C4 balls, deform under such shear stress so that the metal interconnect structures underneath do not delaminate. However, less malleable C4 balls such as lead-free C4 balls transmit a higher fraction of the shear stress to the metal interconnect structures underneath, which induces delamination of metal lines from the dielectric layer in which the metal lines are embedded. Typically, such delamination occurs at the uppermost copper interconnect level.

At the same time, use of a low dielectric constant material in metal interconnect structures is preferred to reduce capacitive coupling between adjacent metal lines, and consequently to reduce RC delays of signals transmitted through the metal lines.

In view of the above, there exists a need for a metal interconnect structure that provides a higher adhesion strength between a metal line and a dielectric layer embedding the metal line, while at the same time minimizing capacitive coupling between the metal line and adjacent metal lines and metal vias, and methods of manufacturing the same.

SUMMARY OF THE INVENTION

The present invention addresses the needs described above by providing a metal interconnect structure in which a fluorine-depleted adhesion layer is located between a metal line and a fluorosilicate glass (FSG) layer to provide an enhanced adhesion between the metal line and the FSG layer.

In the present invention, a fluorosilicate glass (FSG) layer is formed as a dielectric layer in a metal interconnect structure. A line trough and a via cavity are formed within the dielectric layer. A fluorine depleted adhesion layer is formed within the line trough and the via cavity either by a plasma treatment that removes fluorine from exposed surfaces of the FSG layer or by deposition of a substantially fluorine-free dielectric layer. Metal is deposited within the line trough and the via cavity to form a metal line and a metal via. The fluorine depleted adhesion layer provides enhanced adhesion to the metal line compared with prior art structures in which a metal line directly contacts a FSG layer. The enhanced adhesion of metal with an underlying dielectric layer provides higher resistance to delamination for a semiconductor package employing lead-free C4 balls on a metal interconnect structure.

According to an aspect of the present invention, a metal interconnect structure is provided, which comprises:

a fluorosilicate glass (FSG) layer having a first fluorine atomic concentration and located on a substrate;

a fluorine depleted silicate glass layer having a second fluorine atomic concentration and located on a recessed portion of the FSG layer, wherein the second fluorine atomic concentration is about 10% of, or less than 10% of, the first fluorine atomic concentration; and a metal line abutting and embedded within the fluorine depleted silicate glass layer, wherein the metal line is separated from the FSG layer by the fluorine depleted silicate glass layer.

In one embodiment, the metal line laterally abuts an upper sidewall portion of the fluorine depleted silicate glass layer and vertically abuts a horizontal portion of the fluorine depleted silicate glass layer.

In another embodiment, the fluorosilicate glass (FSG) layer comprises fluorine at an atomic concentration from about 1.0% to about 10%.

In even another embodiment, the metal interconnect structure further comprises a metal via having a same composition as the metal line and vertically abutting the metal line, wherein a lower sidewall portion of the fluorine depleted silicate glass layer abuts and laterally surrounds the metal via.

In yet another embodiment, the metal interconnect structure further comprises:

an underlying metal line located directly underneath the metal via; and a dielectric cap layer vertically abutting a bottom surface of the FSG layer, a top surface of the underlying metal line, and the lower sidewall portion of the fluorine depleted silicate glass layer, and laterally surrounding the metal via.

In still another embodiment, the metal interconnect structure further comprises a terminal dielectric layer vertically abutting the FSG layer and laterally abutting the metal line and comprising a dielectric material.

In still yet another embodiment, the terminal dielectric layer comprises at least one of an undoped silicate glass (USG) layer and a silicon nitride layer.

In a further embodiment, a top surface of the metal line is coplanar with a top surface of the fluorine depleted silicate glass layer.

According to another aspect of the present invention, a metal interconnect structure is provided, which comprises:

a fluorosilicate glass (FSG) layer located on a substrate;

a fluorine-free silicate glass layer located on a recessed portion of the FSG layer, wherein the fluorine-free silicate glass layer is substantially free of fluorine; and a metal line abutting and embedded within the fluorine-free silicate glass layer, wherein the metal line is separated from the FSG layer by the fluorine-free silicate glass layer.

In one embodiment, the metal line laterally abuts an upper sidewall portion of the fluorine depleted silicate glass layer and vertically abuts a horizontal portion of the fluorine depleted silicate glass layer.

In another embodiment, the fluorosilicate glass (FSG) layer comprises fluorine at an atomic concentration from about 1.0% to about 10%.

In even another embodiment, the metal interconnect structure further comprises a metal via having a same composition as the metal line and vertically abutting the metal line, wherein a lower sidewall portion of the fluorine depleted silicate glass layer abuts and laterally surrounds the metal via.

In yet another embodiment, the metal interconnect structure further comprises:

an underlying metal line located directly underneath the metal via; and a dielectric cap layer vertically abutting a bottom surface of the FSG layer, a top surface of the underlying metal line, and the lower sidewall portion of the fluorine depleted silicate glass layer, and laterally surrounding the metal via.

In yet another embodiment, the metal interconnect structure further comprises a terminal dielectric layer vertically abutting a top surface of the FSG layer a bottom surface of an upper horizontal portion of the fluorine-free silicate glass layer and laterally abutting an upper sidewall portion of the fluorine-free silicate glass layer and comprising a dielectric material, wherein a top surface of the upper horizontal portion of the fluorine-free silicate glass layer is coplanar with a top surface of the metal line.

In still another embodiment, the metal interconnect structure further comprises the terminal dielectric layer comprises at least one of an undoped silicate glass (USG) layer and a silicon nitride layer.

In still yet another embodiment, a bottom surface of an upper horizontal portion of the fluorine-free silicate glass layer vertically abuts the FSG layer, and wherein a top surface of the upper horizontal portion of the fluorine-free silicate glass layer is coplanar with a top surface of the metal line.

According to yet another aspect of the present invention, a method of forming a metal interconnect structure is provided, which comprises:

forming a fluorosilicate glass (FSG) layer having a first fluorine atomic concentration on a substrate;

patterning a line trough and a via cavity within the FSG layer;

forming a fluorine depleted silicate glass layer having a second fluorine atomic concentration on the fluorosilicate glass (FSG) layer, wherein the second fluorine atomic concentration is about 10% of, or less than 10% of, the first fluorine atomic concentration; and forming a metal line directly on the fluorine depleted silicate glass layer, wherein the metal line is separated from the FSG layer by the fluorine depleted silicate glass layer and is embedded in the fluorine depleted silicate glass layer.

In one embodiment, the fluorine depleted silicate glass layer is formed by treating the FSG layer at the line trough and at the via cavity with plasma, wherein exposed portions of the FSG layer is converted into the fluorine depleted silicate glass layer by losing fluorine.

In another embodiment, the fluorine depleted silicate glass layer is formed by deposition of a fluorine-free silicate glass layer over the FSG layer and within the line trough and the via cavity.

In even another embodiment, the method further comprises:

applying a photoresist over the fluorine depleted silicate glass layer, wherein a portion of the fluorine depleted silicate glass layer within the via cavity is exposed; and removing the exposed portion of the fluorine depleted silicate glass layer employing the photoresist as an etch mask.

In yet another embodiment, the method further comprises forming a terminal dielectric layer comprising a dielectric material directly on the FSG layer prior to the patterning of the metal trough and the via cavity.

In still another embodiment, a top surface of the terminal dielectric layer is coplanar with a top surface of the metal line.

In still yet another embodiment, the method further comprises:

forming an underlying metal line embedded in an underlying dielectric layer;

forming a dielectric cap layer directly on the underlying metal line and the underlying dielectric layer, wherein the FSG layer is formed directly on the dielectric cap layer; and removing a portion of the dielectric cap layer underneath the via cavity after forming the fluorine depleted silicate glass layer, wherein a top surface of the underlying metal line is exposed.

In a further embodiment, a top surface of the fluorine depleted silicate glass layer is coplanar with a top surface of the metal line.

DETAILED DESCRIPTION OF THE INVENTION

As stated above, the present invention relates to a metal interconnect structure employing a fluorine depleted adhesion layer and methods of manufacturing the same, which are now described in detail with accompanying figures.

Figure 1:
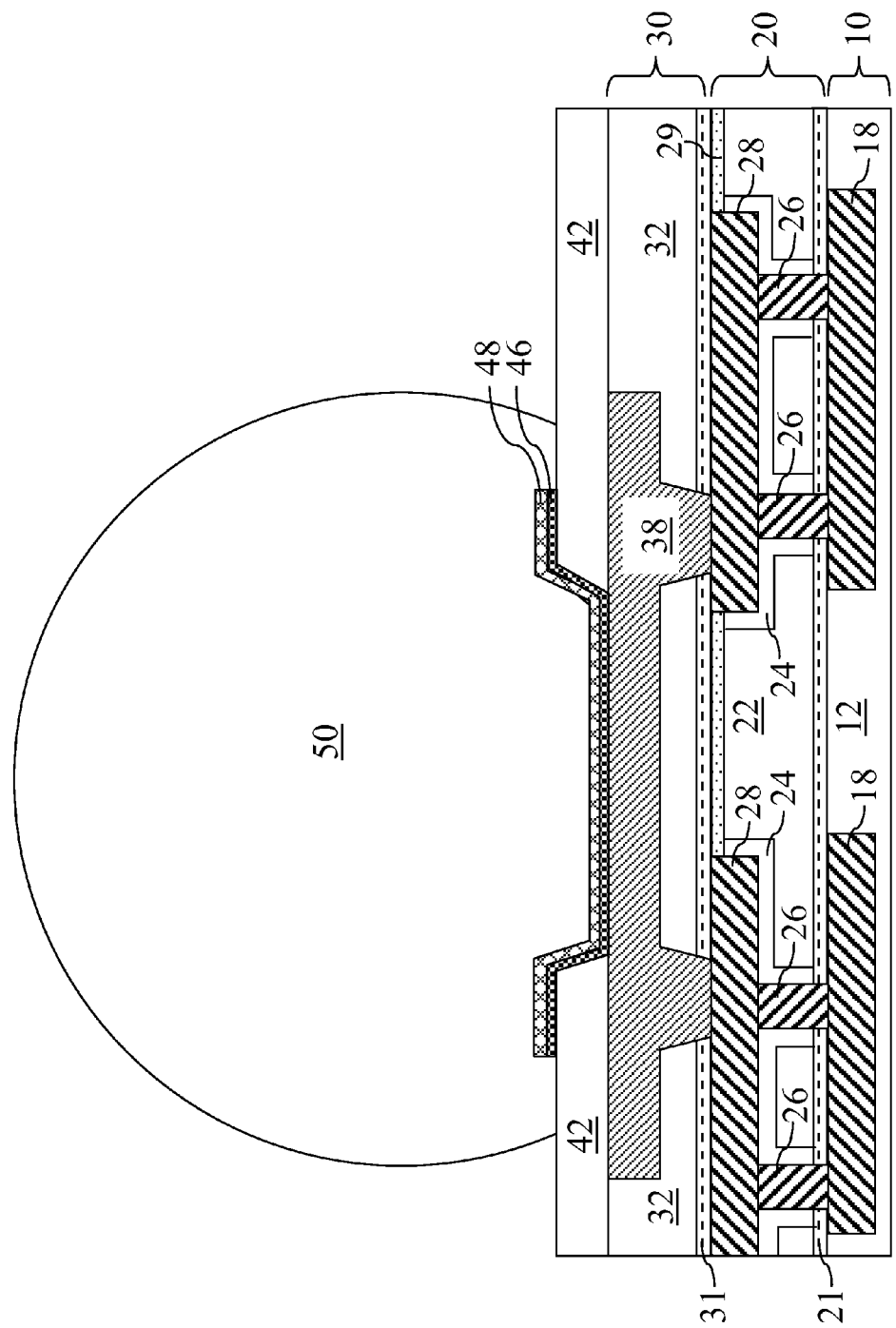
FIG. 1 shows a vertical cross-sectional view of an exemplary structure comprising a C4 ball and a metal interconnect structure incorporating features of the present invention.

Referring to FIG. 1, an exemplary structure comprising a C4 ball and a metal interconnect structure incorporating features of the present invention is shown. The exemplary structure comprises an underlying interconnect level 10, a final interconnect level 20, a metal pad level 30, a dielectric passivation layer 42, a metallic adhesion layer 46, a wetting layer 48, and a lead-free C4 ball 50 that are formed on a semiconductor substrate (not shown). Semiconductor devices (not shown) are formed on the semiconductor substrate by employing semiconductor manufacturing processes known in the art. Typically, additional BEOL interconnect structures (not shown) are present between the semiconductor devices and the underlying interconnect level 10. The additional BEOL interconnect structures facilitate wiring of the semiconductor devices.

The underlying interconnect level 10 includes an underlying dielectric layer 12, underlying metal lines 18, and underlying metal vias (not shown). The underlying interconnect layer 10 may further comprise multiple dielectric layers. The underlying metal lines 18 and the underlying metal vias are embedded in the underlying dielectric layer 12. The underlying dielectric layer 12 may comprise silicon oxide or a low-k dielectric material known in the art. The underlying metal lines 18 and the underlying metal vias comprise a conductive metal such as Cu, and are formed by methods well known in the art.

The final interconnect level 20 includes a dielectric cap layer 21, a fluorosilicate glass (FSG) layer 22, a fluorine depleted silicate glass layer 24, metal vias 26, metal lines 28, and a terminal dielectric layer 29. The metal lines 28 and the metal vias 26 are separated from the FSG layer 22 by the fluorine depleted silicate glass layer 24. The FSG layer 22 comprises fluorosilicate glass and contains fluorine at an atomic concentration from about 1.0% to about 10%, and preferably from about 2% to about 8%, although lesser and greater concentrations are contemplated herein also. The FSG layer 22 has a lower dielectric constant than undoped silicate glass (USG). Typically, the FSG layer 22 has a dielectric constant from about 3.5 to about 3.9. The higher the fluorine atomic concentration of the FSG layer 22 is, the lower the dielectric constant of the FSG layer 22 is. In contrast, undoped silicate glass (USG) has a dielectric constant of about 4.1.

The fluorine depleted silicate glass layer 24 may, or may not comprise fluorine. In other words, fluorine depleted silicate glass layer 24 may be a fluorine containing silicate glass layer or a fluorine-free silicate glass layer. In case the fluorine depleted silicate glass layer 24 contains fluorine, the fluorine atomic concentration within the fluorine depleted silicate glass layer 24 is about 10% or less of the fluorine concentration of the FSG layer 22. The fluorine atomic concentration of the fluorine depleted silicate glass layer 24 is less than or about 1.0% since the fluorine atomic concentration of the FSG layer is less than or about 10%. The reduced fluorine concentration in the fluorine depleted silicate glass layer 24 provides enhanced adhesion with the metal lines 28 compared to the adhesion strength between an FSG layer and a metal line.

The metal lines 28 and the metal vias 26 comprise a conductive metal such as Cu which is deposited on top of a liner that may be comprise TaN, Ta, TiN, Ti, or another equivalent material. Methods of forming the structures included in the final interconnect level 20 is elaborated below employing various exemplary metal interconnect structures.

The metal pad level 30 includes a pad level dielectric cap layer 31, a pad level dielectric layer 32, and a metal pad 38. For example, the pad level dielectric cap layer 31 may comprise silicon nitride. The pad level dielectric layer 32 comprises silicon oxide, silicon nitride, or a combination thereof. The metal pad 38 comprises a metal such as aluminum. Typically, the metal pad 38 is integrally formed with at least one via that electrically connects the upper surface of the metal pad 38 with the metal lines 28.

The dielectric passivation layer 42 comprises an impervious dielectric material that blocks ingress of moisture and oxygen into the metal pad level 30. Exemplary impervious dielectric materials include silicon nitride. The dielectric passivation layer 42 may be a homogeneous layer comprising the impervious dielectric material, or may be a stack of multiple dielectric material layers including an impervious dielectric material layer. The thickness of the dielectric passivation layer 42 may be from about 2.0 μm to about 40 μm, and typically from about 4.0 μm to about 20 μm.

The dielectric passivation layer 32 has an opening that exposes a top surface of the metal pad 38. Typically, the dimension of the opening, e.g., a diameter of the opening, is from about 50 μm to about 100 μm. The opening is formed by lithographic patterning of a photosensitive resist that is removed after patterning of the opening, or a photosensitive polyimide which may form a part of the passivation layer 42.

The metallic adhesion layer 46 is deposited by chemical vapor deposition (CVD) or physical vapor deposition (PVD), i.e., sputtering. The metallic adhesion layer 46 comprises a metallic material that provides good adhesion to underlying structures including the metal pad 38 and the dielectric passivation layer 42. Exemplary materials for the metallic adhesion layer 48 comprise Ti, TiN, and TiW. The thickness of the metallic adhesion layer 46 may be from about 100 nm to about 500 nm, although lesser and greater thicknesses are also explicitly contemplated herein.

The wetting layer 48 is formed directly on the metallic adhesion layer 46. The wetting layer 48 comprises an elemental metal. For example, the wetting layer 48 may comprise pure Cu, pure Ag, or pure Au. The wetting layer 48 may be deposited by electroplating, or preferably, by sputter deposition, i.e., physical vapor deposition (PVD), to reduce the processing cost. The thickness of the wetting layer 48 may be from about 0.1 μm to about 1.0 μm, and preferably from about 0.1 μm to about 0.6 μm, although lesser and greater thicknesses are also contemplated herein.

The lead-free C4 solder ball 50 comprises a Sn—Cu—Ag alloy, in which the concentration of Cu is about 0.7 atomic percent and the concentration of Ag is from about 0.5 atomic percent to about 3.5 atomic percent. Typical diameter of the lead-free C4 ball is from about 3 mils (approximately 75 microns) to about 4 mils (approximately 100 microns). Typically, a plurality of metal pads 38 and lead-free C4 solder balls 50 in an array configuration is employed to provide a bonding of a semiconductor chip to a package.

During temperature cycling caused by operation of the semiconductor chip, the semiconductor chip and the chip package expands with different coefficients of thermal expansion (CTE). Since the top portion and the bottom portion of the lead-free C4 solder ball 50 have different amounts of displacements, and the deformation of the lead-free C4 solder ball 50 is limited due to the composition of the lead-free ball, high shear stress is transmitted through the lead-free solder ball 50 to the metal interconnect structure including the underlying interconnect level 10, the final interconnect level 20, and the metal pad level 30.

The metal pad 38 typically comprises aluminum and the metal lines 28 typically comprise copper. Aluminum stands second in malleability, gold being the most malleable material. Since copper is less malleable than aluminum, the interface between the metal lines 28 and the fluorine depleted silicate glass layer 24 is subjected to the high sheer stress transmitted by the lead-free C4 solder ball 50. The fluorine depleted silicate glass layer 24 of the present invention provides a higher adhesion with the metal lines 28 compared with a fluorosilicate glass (FSG) layer of prior art structures that makes a direct contact with a metal line. At the same time, the FSG layer 24 of the present invention, which does not make a direct contact with the metal lines 28, provides reduction of dielectric constant compared to a dielectric layer comprising undoped silicate glass (USG), thus decreasing RC delay of signals propagated by the metal lines 28.

Figure 2:
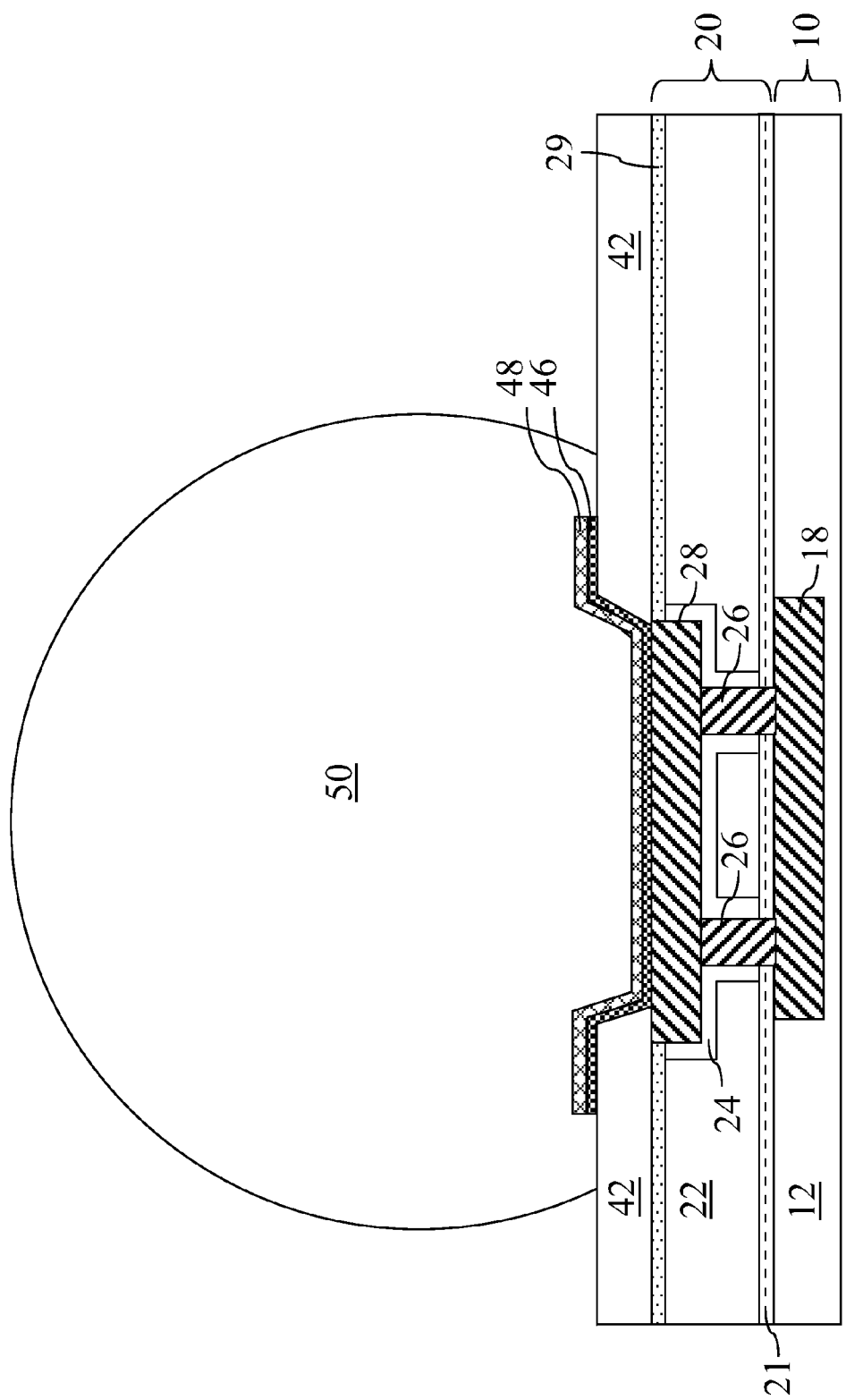
FIG. 2 shows a vertical cross-sectional view of another exemplary structure comprising a C4 ball and a metal interconnect structure incorporating features of the present invention.
Figure 3:
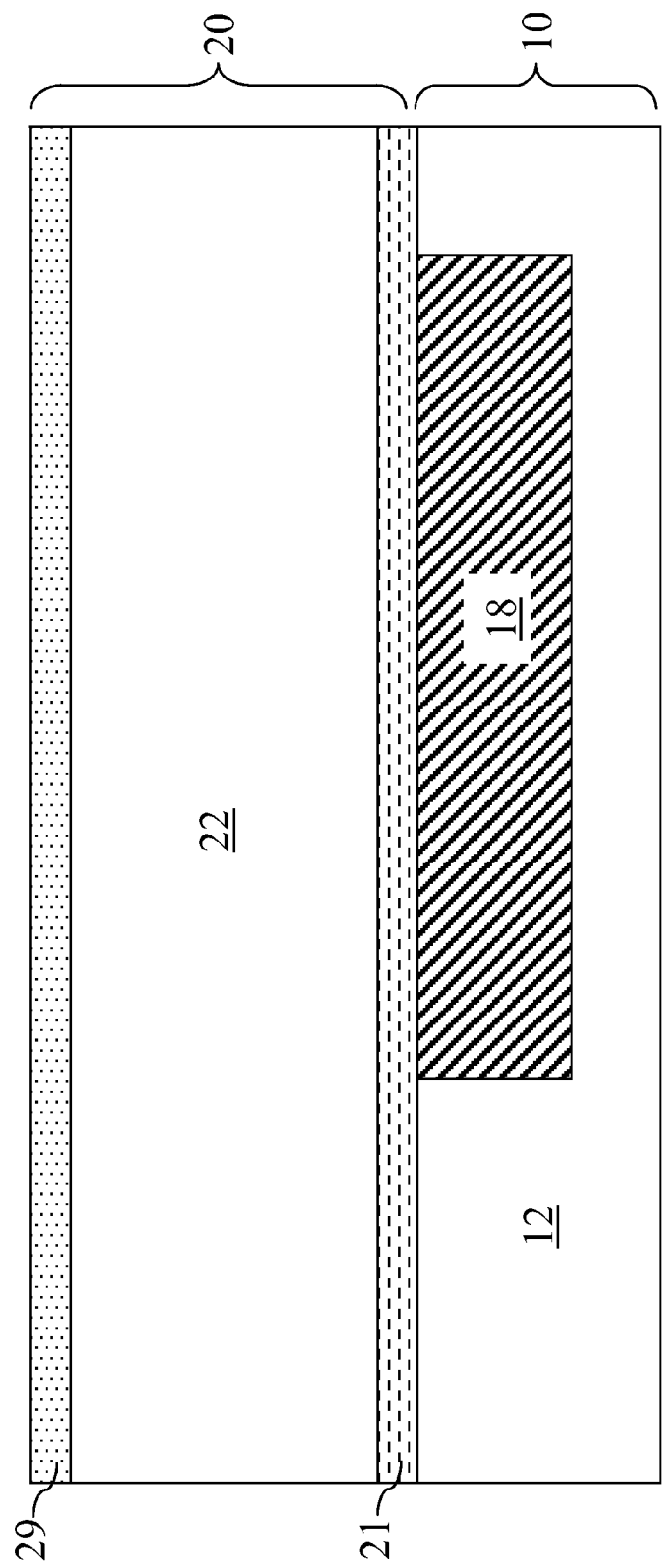
FIGS. 3-7 are vertical cross-sectional views of a first exemplary metal interconnect structure according to the present invention.

Referring to FIG. 2, another exemplary structure comprising a C4 ball and a metal interconnect structure incorporating features of the present invention is shown. In this exemplary structure, the metal pad level 30 is omitted and a dielectric passivation layer 42 is formed directly on the metal lines 28. A metallic adhesion layer 46 is formed directly on the metal line 28. A wetting layer 48 and a lead-free C4 ball 50 are formed on the metallic adhesion layer 46. The fluorine depleted silicate glass layer 24 of the present invention also provides a higher adhesion with the metal lines 28 compared with a fluorosilicate glass (FSG) layer of prior art structures that makes a direct contact with a metal line.

Different embodiments may be employed to form the final interconnect level 20, which are described below. Any of the elements for the final interconnect level 20 from the different embodiments may be incorporated into a structure such as the exemplary structure of FIG. 1 to provide enhanced adhesion between metal lines and the dielectric layers embedding the metal lines.

Referring to FIG. 2, a first exemplary metal interconnect structure according to the present invention comprises an underlying interconnect level 10 and a final interconnect level 20. The underlying interconnect level 10 comprises a metal line 18 and an underlying dielectric layer 12, and may further comprise at least one underlying metal via (not shown). The underlying interconnect layer 10 may comprise a single dielectric layer or multiple dielectric layers having heterogeneous composition. The underlying metal line 18 and the at least one underlying metal via are embedded in the underlying dielectric layer 12. A barrier liner (not shown) may be embedded within the underlying metal lien 18, typically at an interface between the metal line 18 and the underlying dielectric layer 12. The underlying dielectric layer 12 may comprise silicon oxide or a low-k dielectric material known in the art. The underlying metal line 18 and the at least one underlying metal via comprise a conductive metal such as Cu, and are formed by methods well known in the art.

The final interconnect level 20 includes a dielectric cap layer 21, a fluorosilicate glass (FSG) layer 22, and a terminal dielectric layer 29. The dielectric cap layer 21 comprises an impervious dielectric material that impedes or prevents diffusion of mobile ions, moisture, and/or other impurities from diffusion across different interconnect levels, and specifically, between the underlying interconnect level 10 and the final interconnect level 20. The dielectric cap layer 21 typically comprises a dielectric oxide or a dielectric nitride. For example, the dielectric cap layer 21 may comprise silicon nitride. The dielectric cap layer 21 may be formed, for example, by plasma enhanced chemical vapor deposition (PECVD) or high density plasma chemical vapor deposition (HDPCVD). The thickness of the dielectric cap layer 21 may be from about 5 nm to about 100 nm, and typically from about 20 nm to about 80 nm, although lesser and greater thicknesses are contemplated also.

The fluorosilicate glass (FSG) layer 22 comprises fluorosilicate glass including fluorine at an atomic concentration from about 1.0% to about 10%, and preferably from about 2% to about 9%, and more preferably from about 4% to about 8%, although lesser and greater concentrations are contemplated herein also. The FSG layer 22 has a lower dielectric constant than undoped silicate glass (USG). Typically, the FSG layer 22 has a dielectric constant from about 3.5 to about 3.9. The FSG layer 22 may be formed, for example, by plasma enhanced chemical vapor deposition (PECVD), high density plasma chemical vapor deposition (HDPCVD), or by a spin-on coating. Tetra-ethyl-ortho-silicate (TEOS) may be employed as a precursor material for formation of the FSG layer along with a fluorine dopant such as $SiF_4$. The thickness of the FSG layer 22 may be from about 100 nm to about 1,500 nm, and typically from about 300 nm to about 800 nm, although lesser and greater thicknesses are contemplated also.

The terminal dielectric layer 29 comprises a dielectric material such as a dielectric nitride or a dielectric oxide. For example, the terminal dielectric layer 29 may comprise undoped silicate glass (USG) or silicon nitride. The terminal dielectric layer 29 may, or may not, comprise fluorine. The terminal dielectric layer 29 may be formed, for example, by plasma enhanced chemical vapor deposition (PECVD) or high density plasma chemical vapor deposition (HDPCVD). The thickness of the terminal dielectric layer 29 may be from about 5 nm to about 400 nm, and typically from about 20 nm to about 200 nm, although lesser and greater thicknesses are contemplated also.

Figure 4:
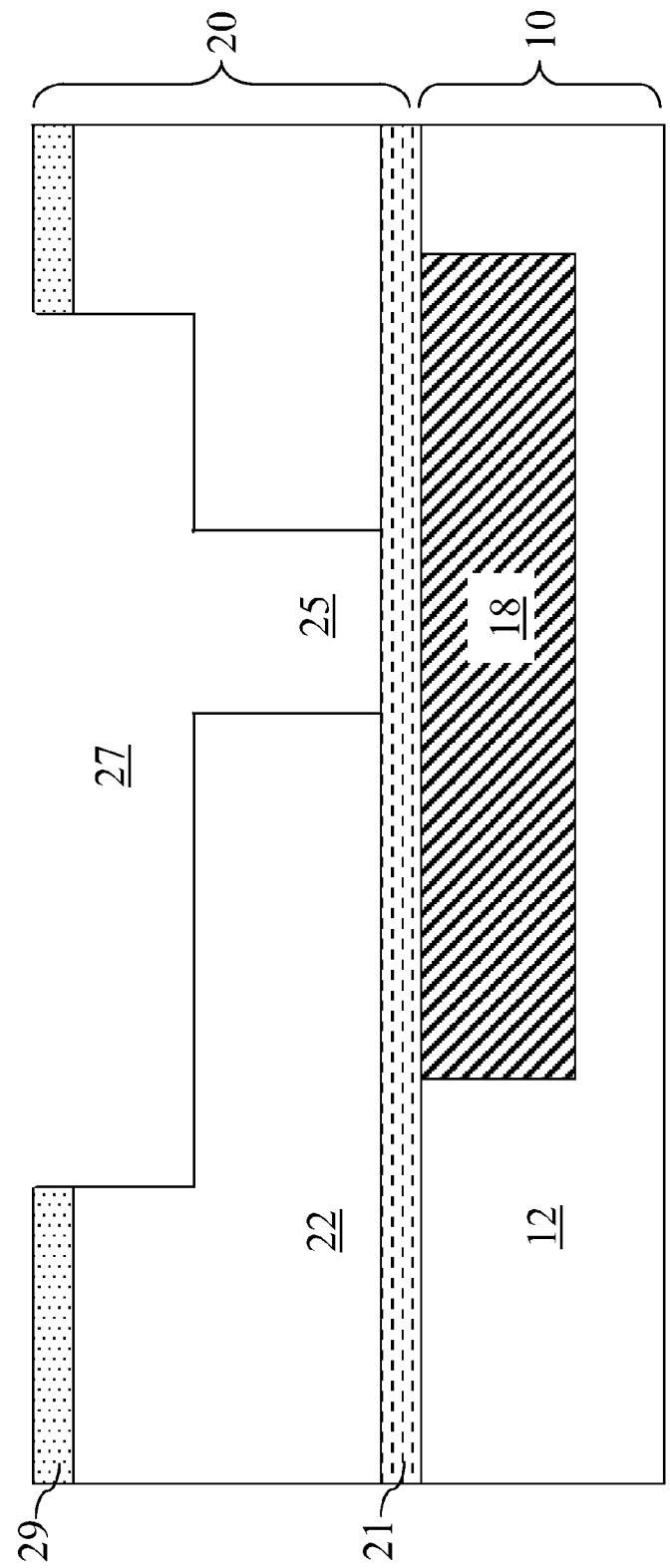

Referring to FIG. 4, a via cavity 25 and a line trough 27 are formed in the final interconnect level 20 by lithographic patterning. For example, a first photoresist (not shown) and a first anisotropic etch may be employed to pattern the via cavity 25 and a second photoresist (not shown) and a second anisotropic etch may be employed to pattern the line trough 27. Methods of forming via cavities and line troughs are known in the art. A bottom surface of the line trough 27 is located between the interface of the FSG layer 22 and the terminal dielectric layer 29 and the interface between the FSG layer 22 and the dielectric cap layer 21. Typically, the area of the line trough 27 overlies the entirety of the area of the via cavity 25. A top surface of the dielectric cap layer 21 is exposed at the bottom of the via cavity 25.

Figure 5:
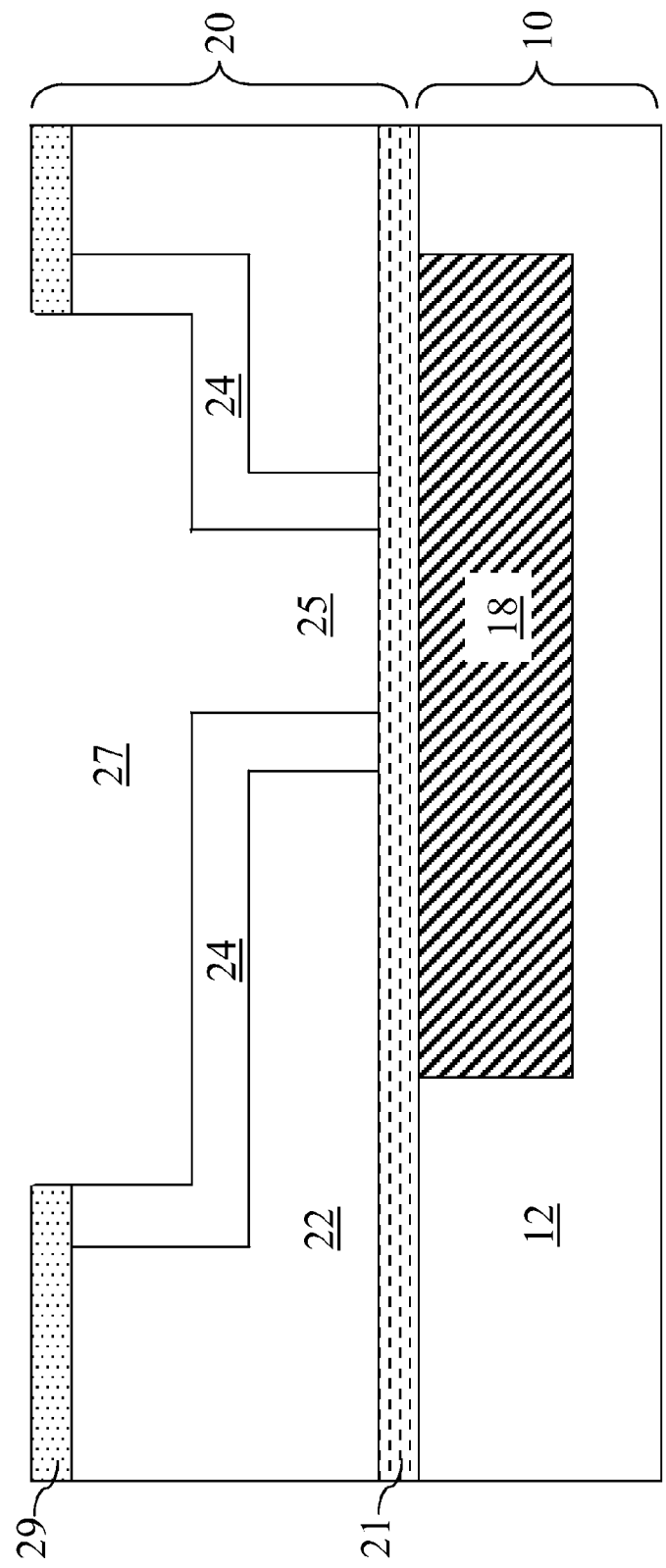

Referring to FIG. 5, a plasma treatment is performed on exposed surfaces of the FSG layer 22 to convert the treated portions of the FSG layer 22 into a fluorine depleted silicate glass layer 24. Hydrogen and/or nitrogen plasma are employed to remove fluorine from exposed surfaces of the FSG layer 22. The duration of the plasma treatment is extended over a sufficient time to allow bulk diffusion of fluorine over a sufficiently wide region underneath the exposed surface of the FSG layer 22. The time period of the plasma treatment and the processing temperature are optimized to deplete fluorine within a target distance from the exposed surfaces of the FSG layer 22. The time period for the plasma treatment may be from about 5 seconds to about 300 seconds, and the processing temperature may be from about 200° C. to about 500° C. The plasma treatment occurs after patterning of the FSG layer 22, but prior to the deposition of the liner and metal. The exposed surfaces of the FSG layer 22 become "fluorine-depleted."

The atomic concentration of fluorine at the exposed surface of the FSG layer 22 after the plasma treatment is less than or about 10% of the original fluorine atomic concentration within the FSG layer 22 prior to the plasma treatment. The portion of the FSG layer 22 that loses sufficient amount of fluorine during the plasma treatment so that the fluorine atomic concentration falls below 10%, and preferably below 5%, of the original fluorine atomic concentration of the FSG layer 22 prior to the plasma treatment constitutes the fluorine depleted silicate glass layer 24. The remaining portion of the FSG layer 22 after the plasma treatment has a fluorine atomic concentration higher than, or equal to, 10% of the original fluorine atomic concentration of the FSG layer 22 prior to the plasma treatment. Portions of the FSG layer 22 at a sufficient distance from the fluorine depleted silicate glass layer 24 may have substantially the same fluorine atomic concentration as the fluorine concentration of the FSG layer 22 prior to the plasma treatment.

The fluorine depleted silicate glass layer 24 is fluorine-depleted, i.e., has a low level of fluorine if any. For example, if the FSG layer 22 has a fluorine atomic concentration up to 10%, the fluorine depleted silicate glass layer 24 may have a fluorine atomic concentration less than 1.0%. If the FSG layer 22 has a fluorine atomic concentration of about 1.0%, the fluorine depleted silicate glass layer 24 may have a fluorine atomic concentration less than 0.1%, and preferably less than 500 parts per million (ppm). The width of the fluorine depleted silicate glass layer 24 may be from about 5 nm to about 300 nm, and preferably from about 20 nm to about 150 nm, although lesser and greater widths are contemplated herein also.

Preferably, the terminal dielectric layer 29 does not comprise fluorine, and the plasma treatment does not induce any substantial changes to the terminal dielectric layer 29. In case the terminal dielectric layer 29 comprises fluorine, the amount of fluorine in the terminal dielectric layer 29 decreases substantially due to the plasma treatment. For example, the concentration of fluorine at the exposed surface of the terminal dielectric layer 29 may decrease by more than 90% of the original fluorine concentration within the terminal dielectric layer 29 prior to the plasma treatment.

Figure 6:
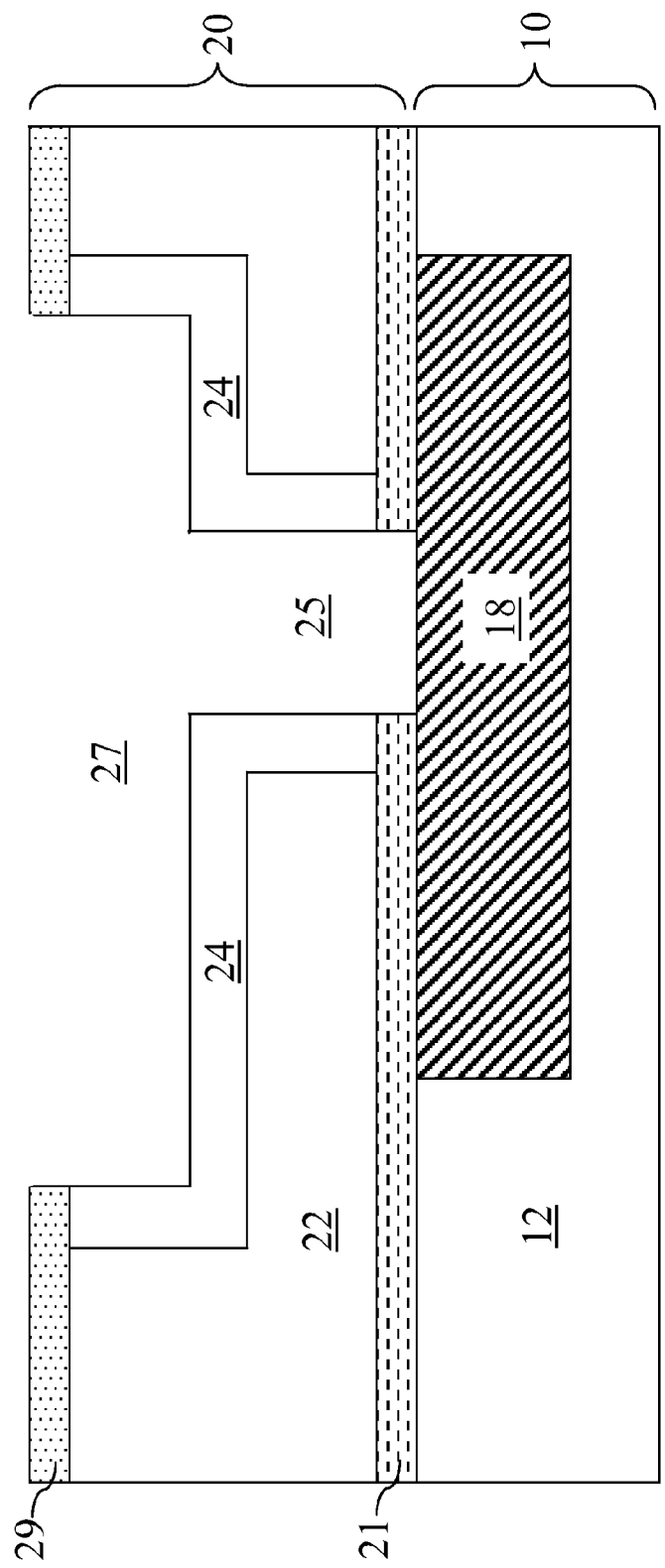

Referring to FIG. 6, the exposed portion of the dielectric cap layer 21 is removed from underneath the via cavity 25 by an etch. The etch may be an anisotropic etch or an isotropic etch. Also, the etch may be a dry etch or a wet etch. Not necessarily but preferably, the etch is selective to the fluorine depleted silicate glass layer 24 and/or the terminal dielectric layer 29. An upper surface of the underlying metal line 18 is exposed underneath the via cavity 25.

Figure 7:
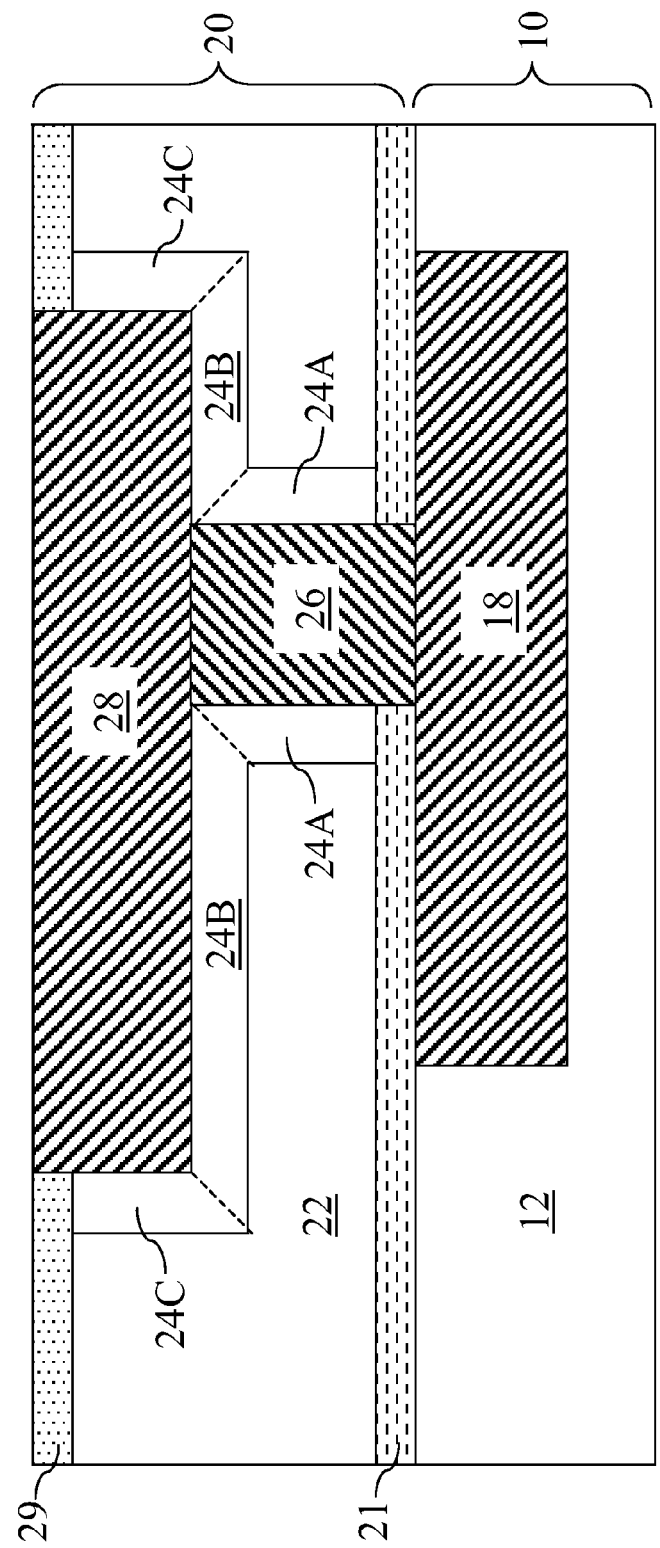

Referring to FIG. 7, metal is deposited within the via cavity 25 and the line trough 27 and is planarized to form a metal via 26 and a metal line 28. Specifically, the metal is deposited within the via cavity 25 and the line trough 27 by physical vapor deposition and plating, and is planarized employing the terminal dielectric layer 29 as a stopping layer, for example, by chemical mechanical planarization (CMP). A top surface of the metal line 28 is thus coplanar with a top surface of the terminal dielectric layer 29. The metal via 26 and the metal line 28 are formed integrally without a physically manifested interface therebetween, i.e., the metal via and the metal line 28 are of unitary construction. The metal line 28 and the metal via 26 comprise a conductive metal such as Cu. The metal line 28 and the metal via 26 are separated from the FSG layer 22 by the fluorine depleted silicate glass layer 24.

A lower sidewall portion 24A of the fluorine depleted silicate glass layer 24 laterally abuts and surrounds the metal via 26. A horizontal portion 24B of the fluorine depleted silicate glass layer 24 vertically abuts a bottom surface of the metal line 28. An upper sidewall portion 24C of the fluorine depleted silicate glass layer 24 laterally abuts and surrounds the metal line 28. Sidewalls of the terminal dielectric layer 29 laterally abut sidewalls of the metal line 28. The metal via 26 vertically abuts a top surface of the underlying metal line 18, and is laterally surrounded by the dielectric cap layer 21.

The adhesion strength between the fluorine depleted silicate glass layer 24 and the metal line 28 and the metal via 26 is greater than the adhesion strength between fluorosilicate glass and a metal line and a metal via, and is comparable with the adhesion strength between undoped silicate glass (USG) and a metal line and a metal via of the same construction. In other words, by reducing the fluorine concentration in the fluorine depleted silicate glass layer 24, enhanced adhesion strength is provided to the metal line 28 and the metal via 26 over a comparable structure in which a metal line and a metal via directly contacts a fluorosilicate glass layer.

In addition, the bulk of the final interconnect level 20 is occupied by the FSG layer 22, which provides a lower dielectric constant compared with undoped silicate glass (USG). Thus, the first exemplary metal interconnect structure provides good adhesion strength between a metal line 28 and a metal via 26 and an assembly of dielectric layers, which comprise the fluorine depleted silicate glass layer 24, the terminal dielectric layer 29, and the FSG layer 22, as well as providing a reduced dielectric constant and a reduced capacitive coupling conferred by the use of fluorosilicate glass as a dielectric material separating metallic structures.

Figure 8:
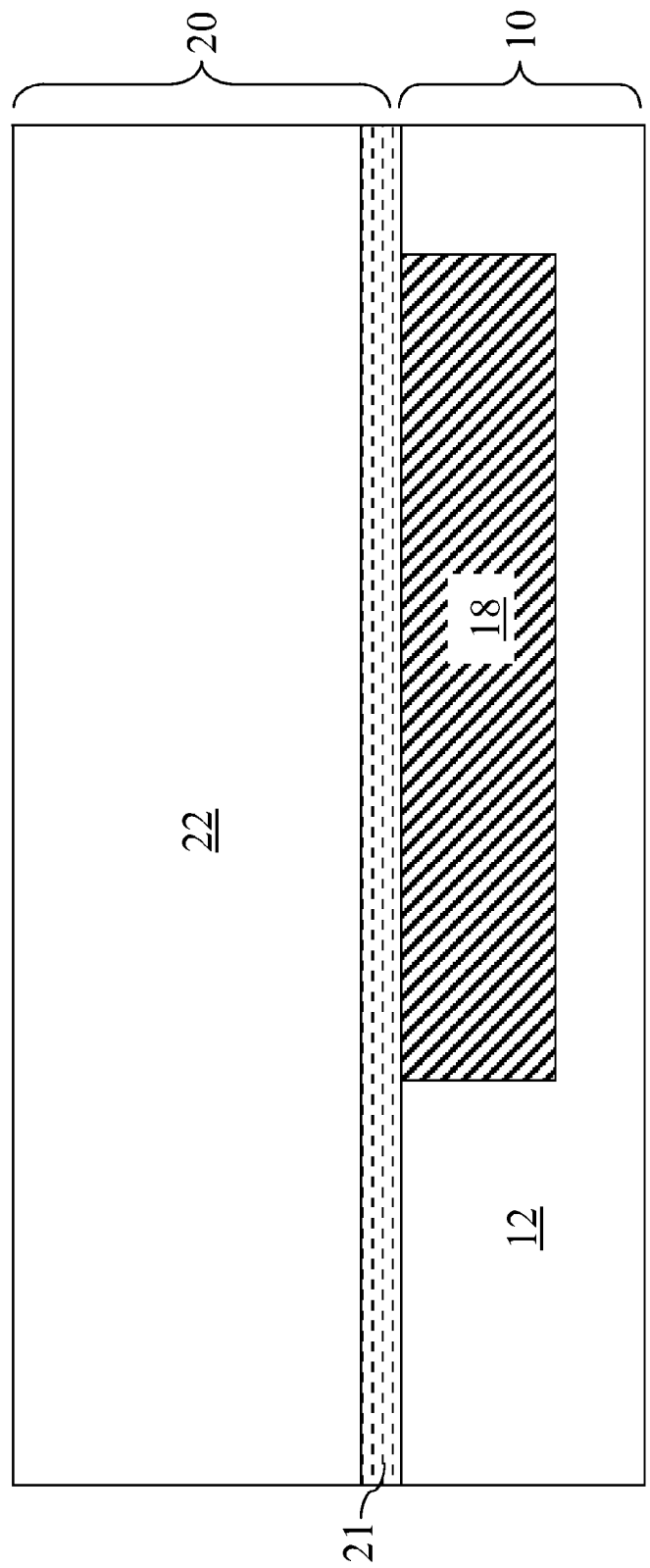
FIGS. 8-12 are vertical cross-sectional views of a second exemplary metal interconnect structure according to the present invention.

Referring to FIG. 8, a second exemplary metal interconnect structure may be formed in a similar manner as the methods to form the first exemplary metal interconnect structure of FIG. 2, but by omitting the formation of the terminal dielectric layer 29. All other elements of FIG. 7 have the same structural and compositional properties as the first exemplary metal interconnect structure of FIG. 2.

Figure 9:
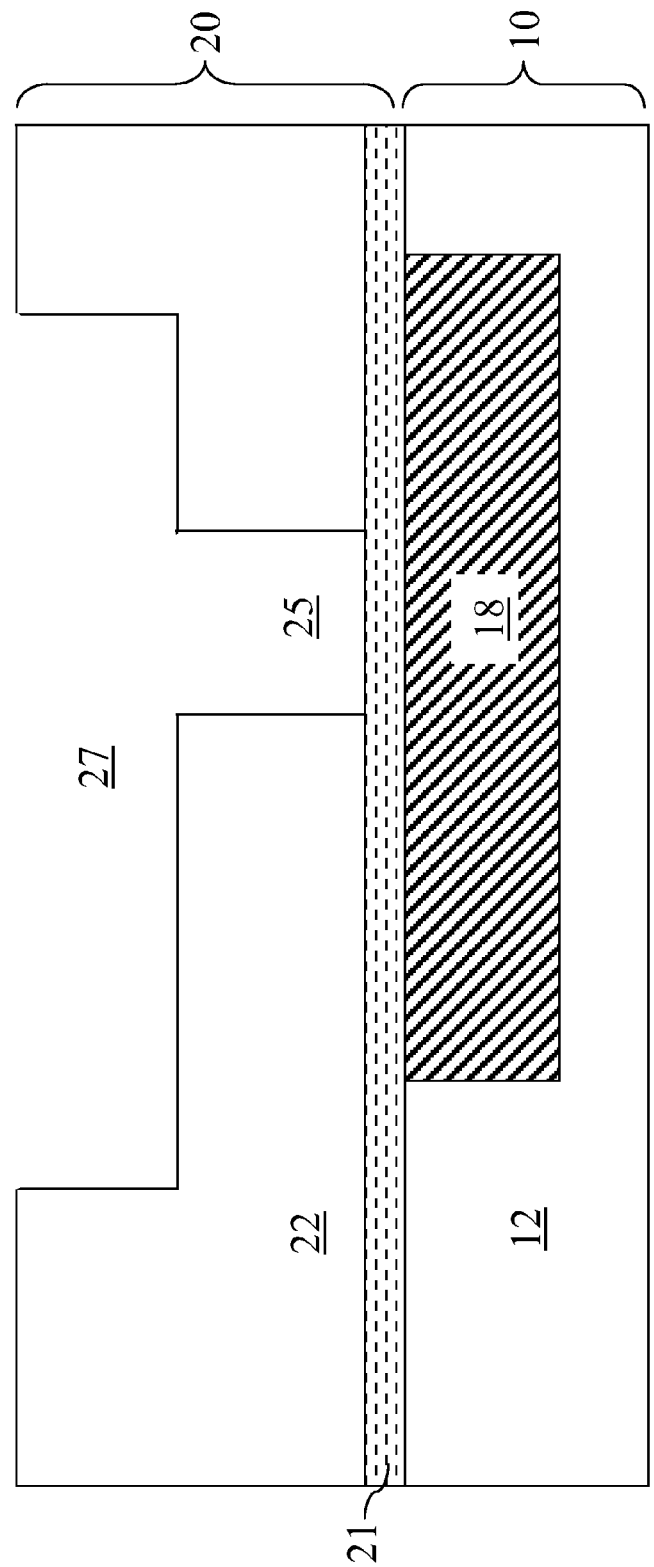
Figure 10:
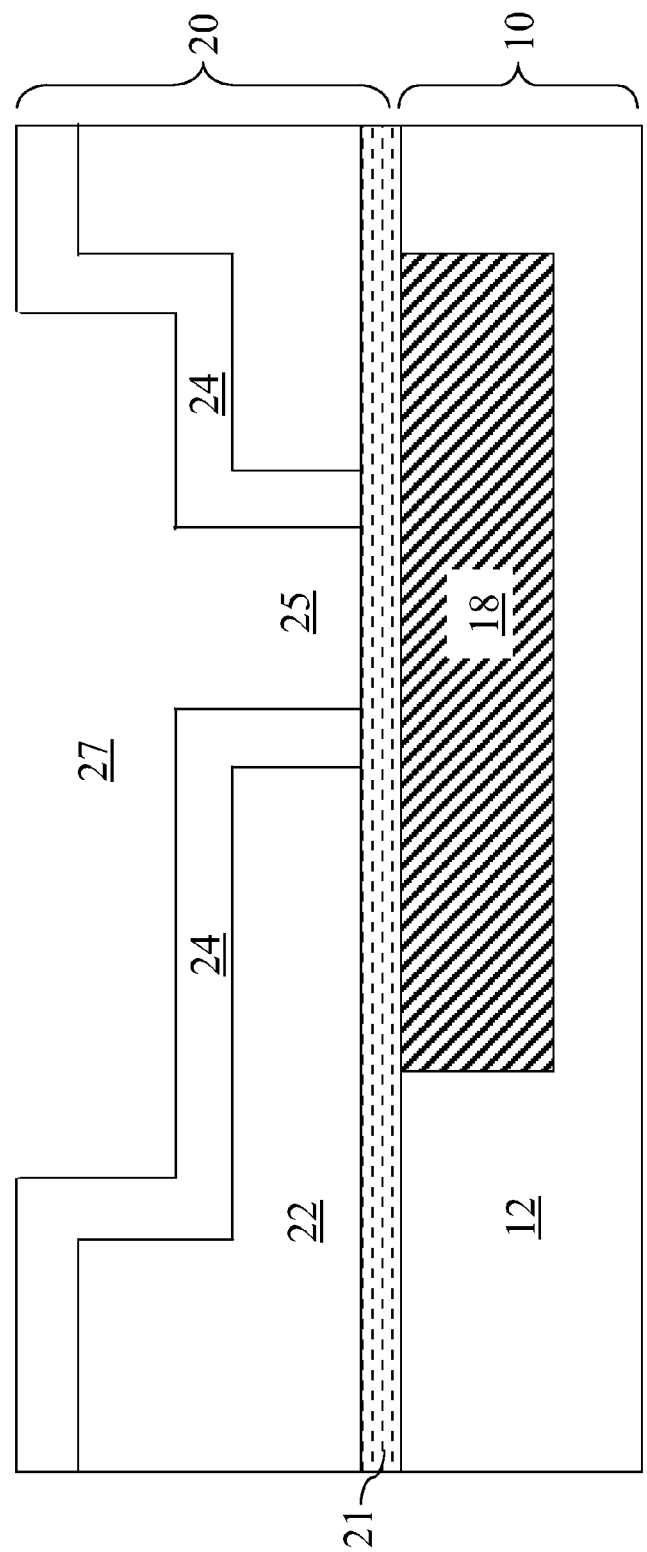
Figure 11:
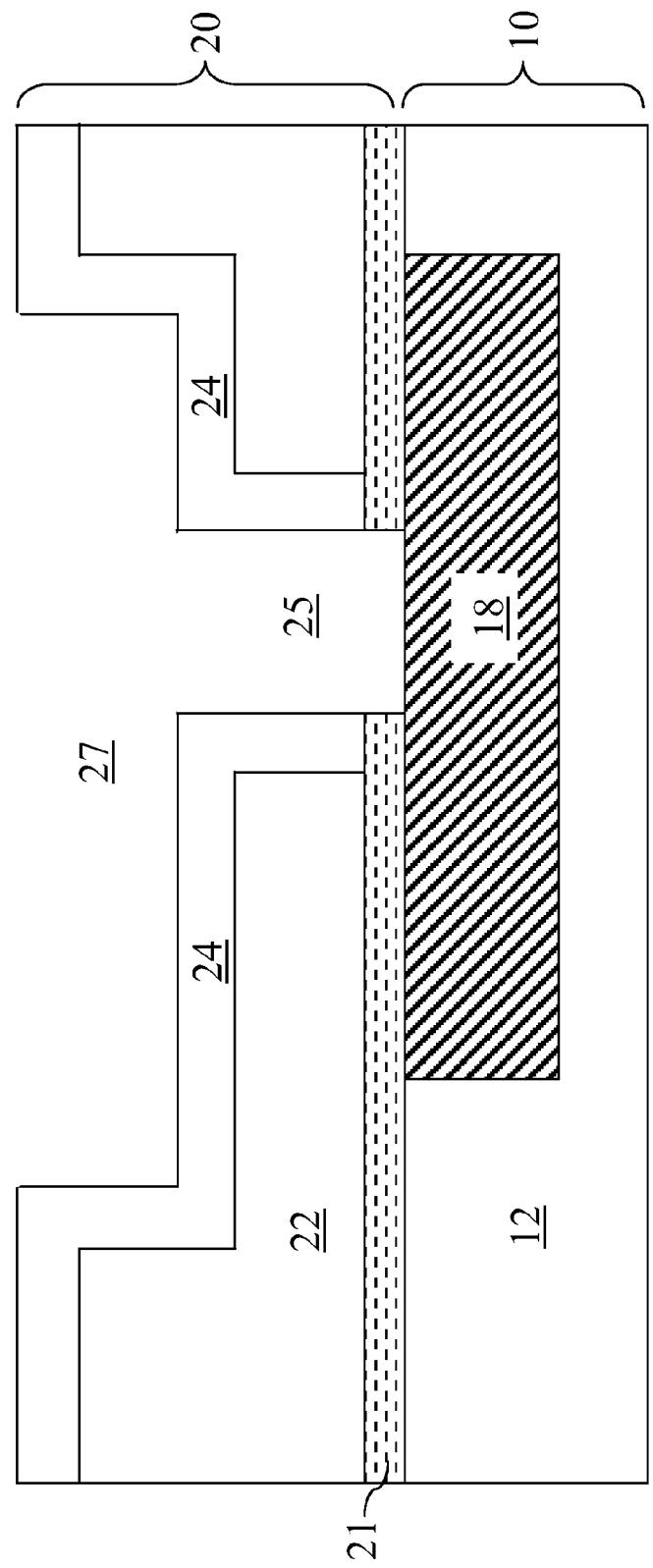

Referring to FIGS. 9-11, the processing steps employed in the first metal interconnect structure are performed. Since a top surface of the FSG layer 22 is exposed above the line trough 27 during the plasma treatment, the fluorine depleted silicate glass layer 24 includes the region directly underneath the top surface of the FSG layer 22 above the line trough 27.

Figure 12:
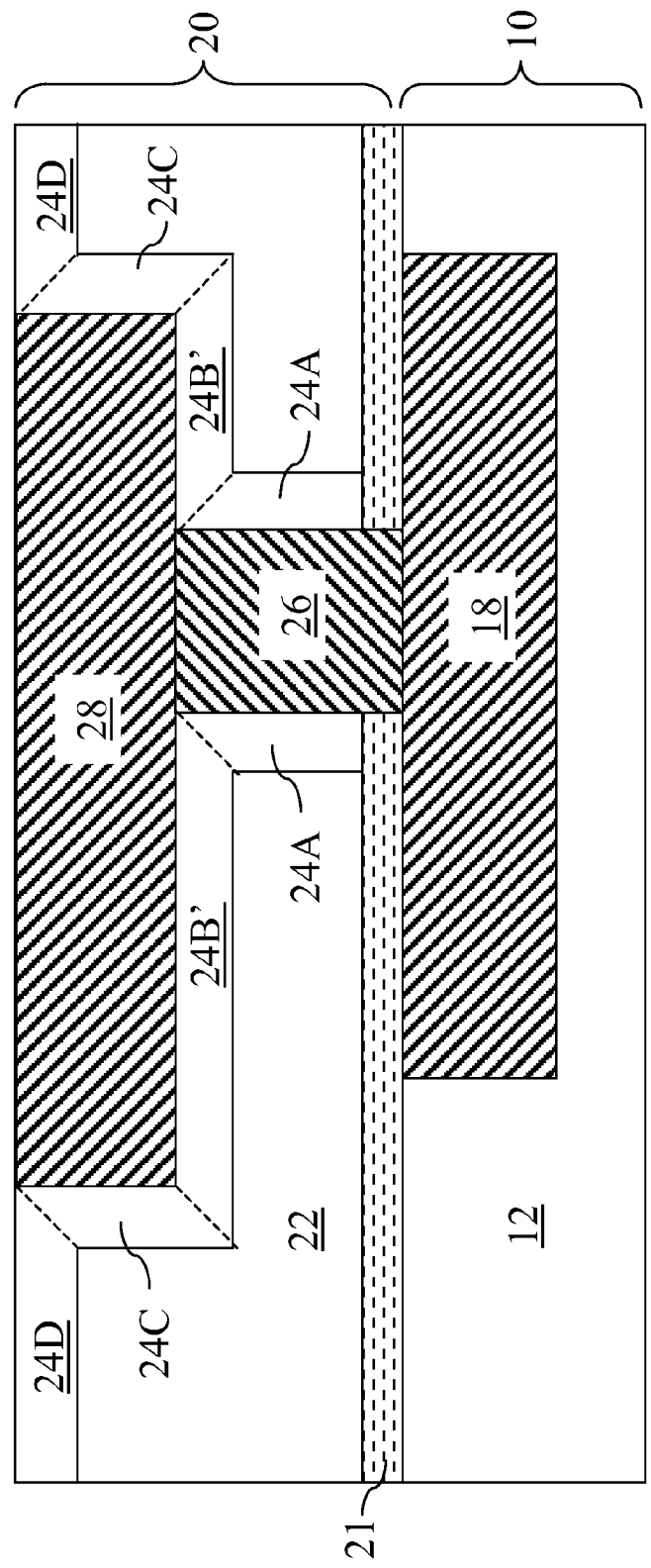

Referring to FIG. 12, metal is deposited within the via cavity 25 and the line trough 27 and is planarized to form a metal via 26 and a metal line 28. The fluorine depleted silicate glass layer 24 may be employed as a stopping layer during chemical mechanical planarization (CMP). The metal via 26 and the metal line 28 are formed integrally without a physically manifested interface therebetween, i.e., the metal via and the metal line 28 are of unitary construction. The metal line 28 and the metal via 26 comprise a conductive metal such as Cu. The metal line 28 and the metal via 26 are separated from the FSG layer 22 by the fluorine depleted silicate glass layer 24.

A lower sidewall portion 24A of the fluorine depleted silicate glass layer 24 laterally abuts and surrounds the metal via 26. A lower horizontal portion 24B' of the fluorine depleted silicate glass layer 24 vertically abuts a bottom surface of the metal line 28. An upper sidewall portion 24C of the fluorine depleted silicate glass layer 24 laterally abuts and surrounds the metal line 28. A top surface of the metal line 28 is coplanar with a top surface of an upper horizontal portion 24D of the fluorine depleted silicate glass layer 24. The lower sidewall portion 24A, the lower horizontal portion 24B', the upper sidewall portion 24C, and the upper horizontal portion 24D collectively constitute the fluorine depleted silicate glass layer 24. The metal via 26 vertically abuts a top surface of the underlying metal line 18 and a bottom surface of the metal line 28, and is laterally surrounded by the dielectric cap layer 21.

The second exemplary metal interconnect structure provides both good adhesion strength between a metal line 28 and a metal via 26 and an assembly of dielectric layers, which comprise the FSG layer 22 and the fluorine depleted silicate glass layer 24, and a reduced capacitive coupling between metallic structures in the same manner as the first exemplary metal interconnect structure.

Figure 13:
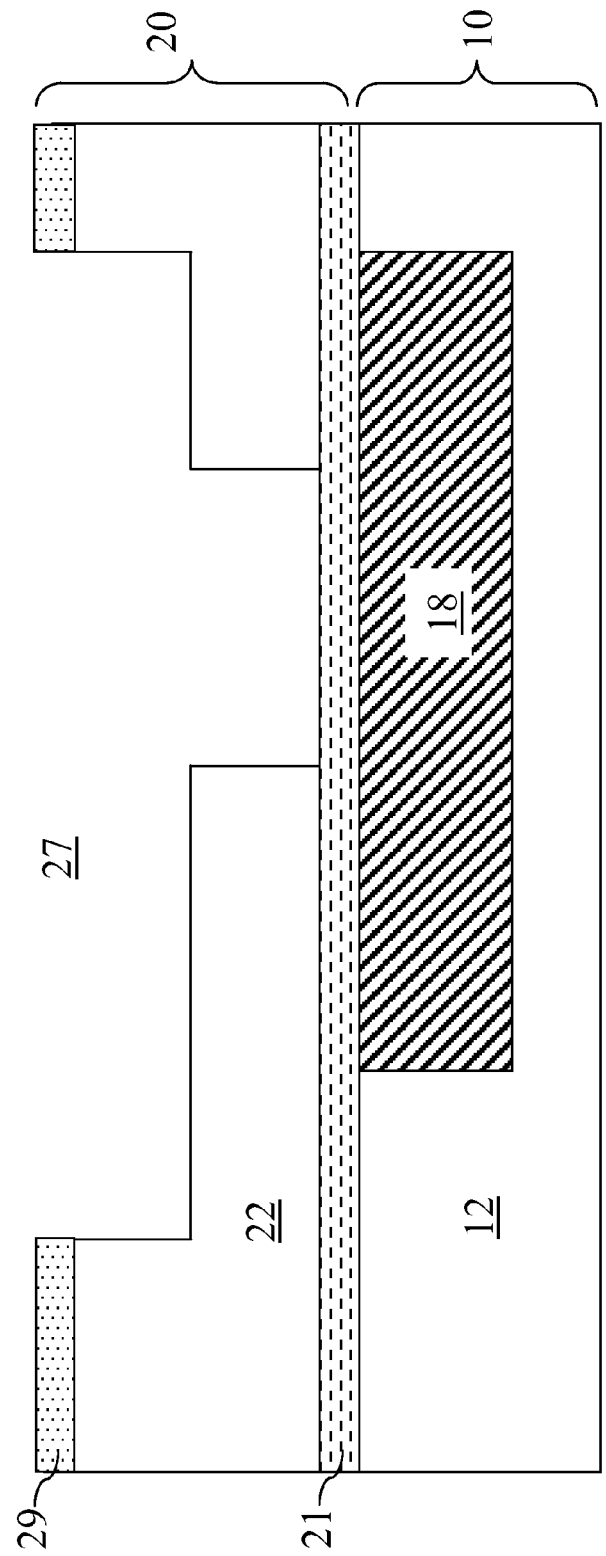
FIGS. 13-17 are vertical cross-sectional views of a third exemplary metal interconnect structure according to the present invention.

Referring to FIG. 13, a third exemplary metal interconnect structure is derived from the first exemplary metal interconnect structure of FIG. 4 by employing the same processing steps as described above.

Figure 14:
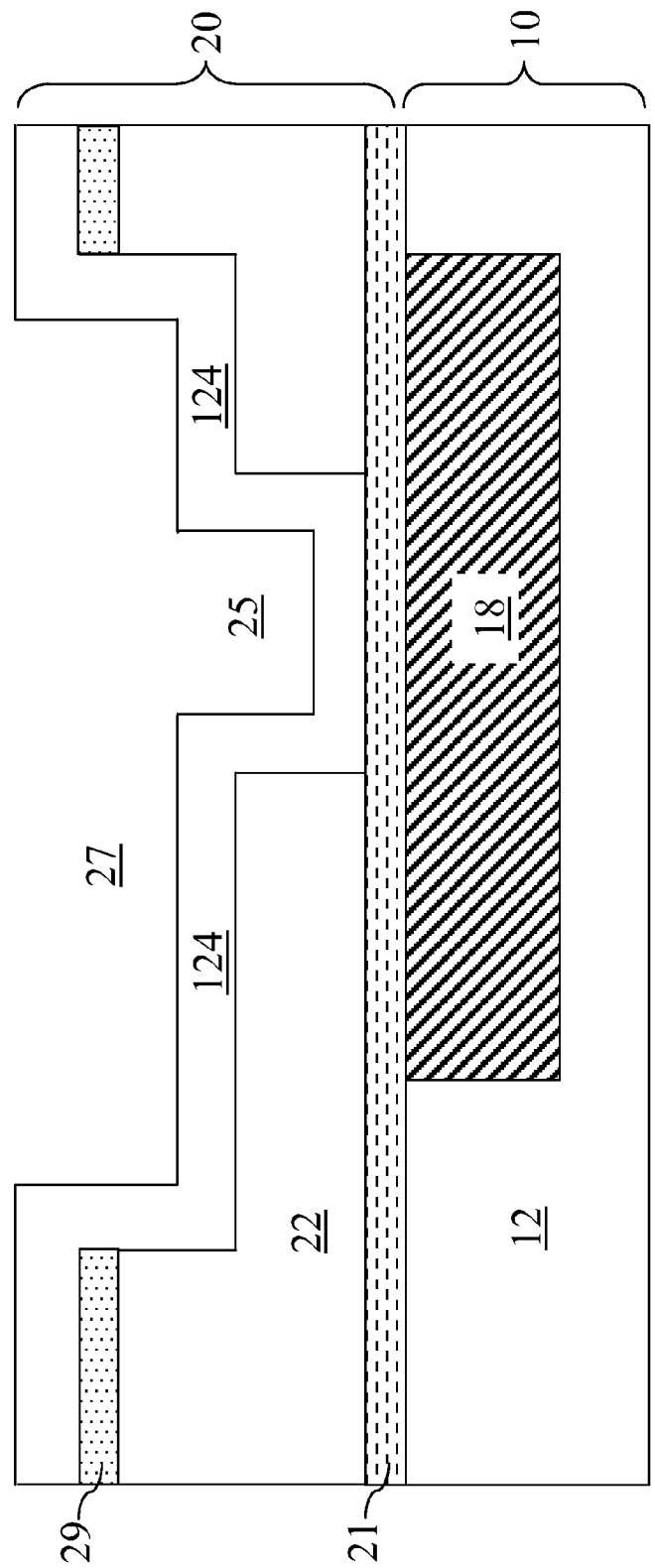

Referring to FIG. 14, a fluorine-free silicate glass layer 124 is formed by chemical vapor deposition (CVD), such as plasma enhanced chemical vapor deposition (PECVD) or high density plasma chemical vapor deposition (HDPCVD). Tetra-ethyl-ortho-silicate (TEOS) may be employed as a precursor. The fluorine-free silicate glass layer 124 may comprise undoped silicate glass (USG), or may comprise other dopants such as boron, phosphorous, or a combination thereof. Preferably, the fluorine-free silicate glass layer comprises USG deposited as a highly dense film which may be achieved with lower deposition rates.

The fluorine-free silicate glass layer 124 does not comprise fluorine. In other words, the atomic concentration of fluorine in the fluorine-free silicate glass layer 124 is below a trace level. Thus, the fluorine-free silicate glass layer 124 is a fluorine depleted silicate glass layer by definition.

Not necessarily but preferably, the deposition of the fluorine-free silicate glass layer 124 is conformal, i.e., vertical portions and horizontal portions of the fluorine-free silicate glass layer 124 have substantially the same thickness. The thickness of the fluorine-free silicate glass layer 124, as measured at a horizontal portion at the line trough 27 may be from about from about 5 nm to about 300 nm, and preferably from about 20 nm to about 150 nm, although lesser and greater thicknesses are contemplated herein also.

Figure 15:
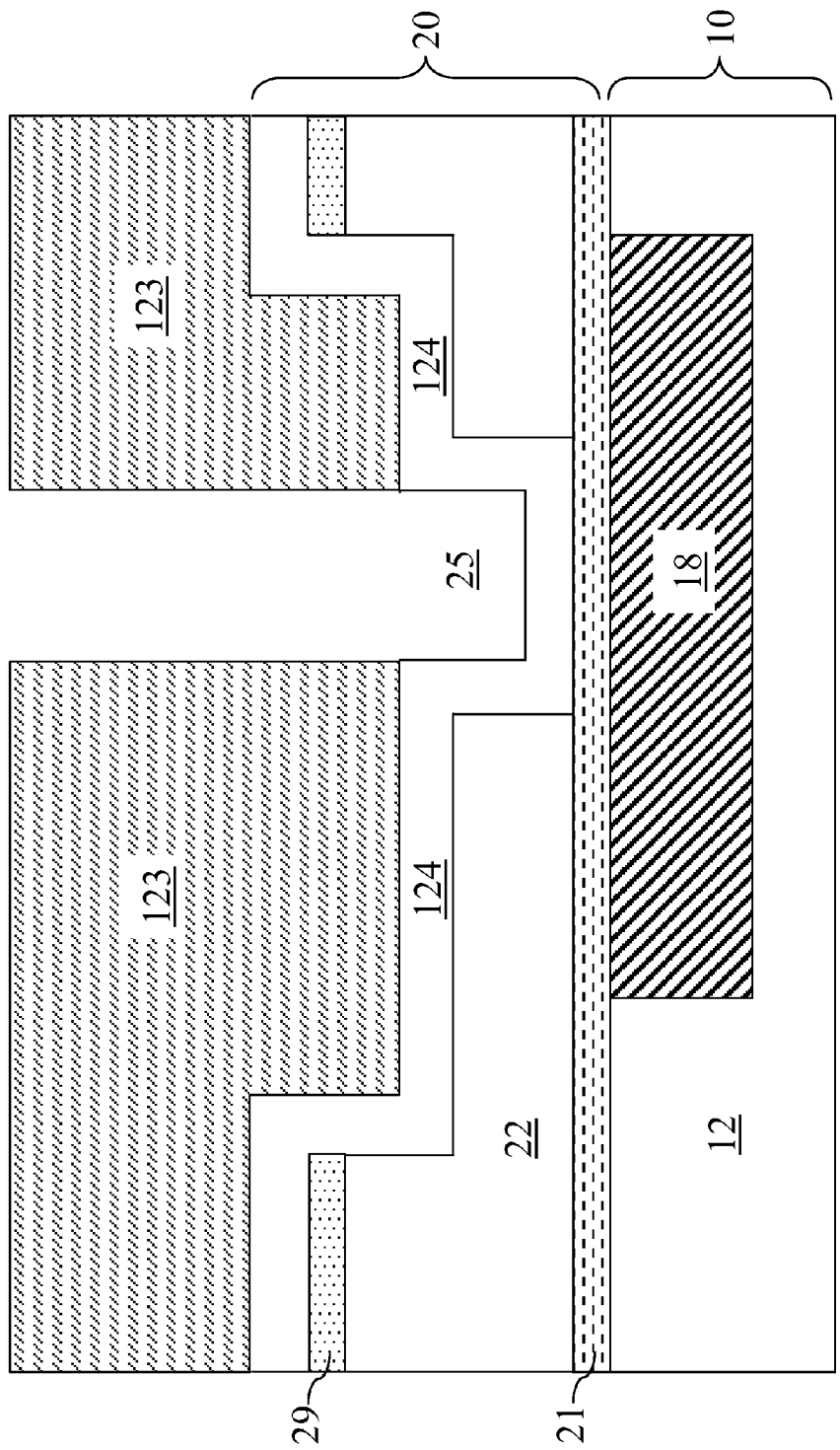

Referring to FIG. 15, a photoresist 123 is applied over the third exemplary metal interconnect structure and lithographically patterned to expose the via cavity 25, while covering the portion of the line trough 27 that does not overlap with the via cavity 25.

Figure 16:
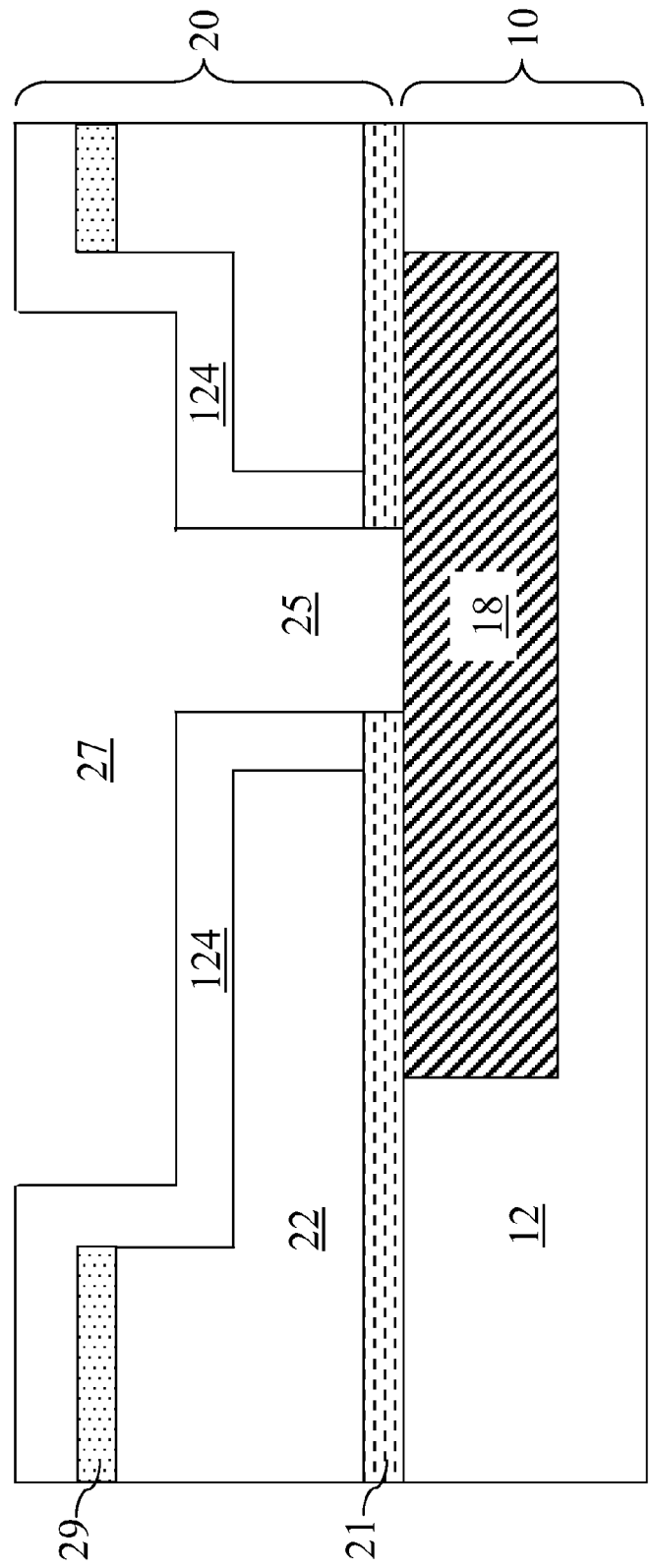

Referring to FIG. 16, a bottom portion of the fluorine-free silicate glass layer 124 located within the opening in the photoresist 123 is removed by an etch employing the photoresist 123 as an etch mask. A wet etch or a dry etch may be employed to remove the bottom portion of the fluorine-free silicate glass layer 124 underneath the via cavity 25. The photoresist 123 is thereafter removed.

Figure 17:
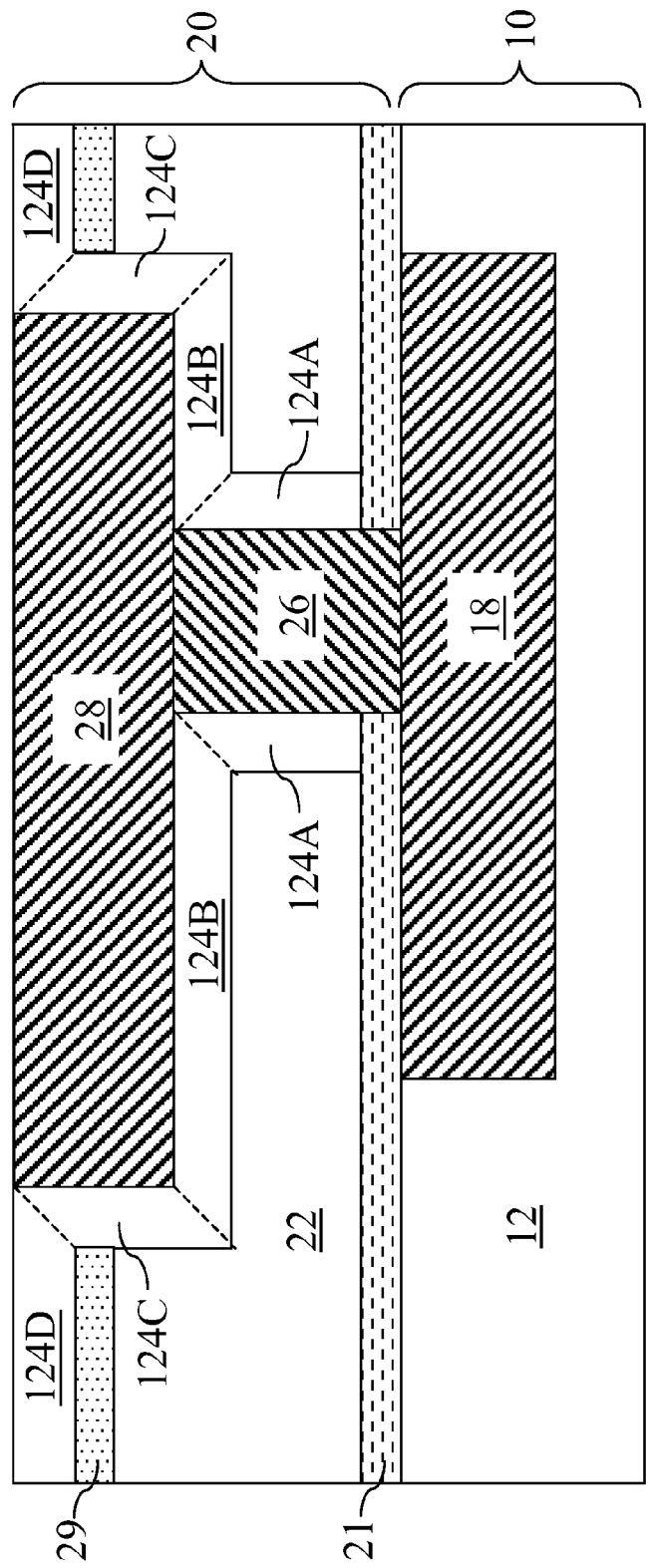

Referring to FIG. 17, metal is deposited within the via cavity 25 and the line trough 27 and is planarized to form a metal via 26 and a metal line 28. The fluorine-free silicate glass layer 124 may be employed as a stopping layer during chemical mechanical planarization (CMP). The metal via 26 and the metal line 28 are formed integrally without a physically manifested interface therebetween, i.e., the metal via and the metal line 28 are of unitary construction. The metal line 28 and the metal via 26 comprise a conductive metal such as Cu. The metal line 28 and the metal via 26 are separated from the FSG layer 22 by the fluorine-free silicate glass layer 124.

A lower sidewall portion 124A of the fluorine depleted silicate glass layer 124 laterally abuts and surrounds the metal via 26. A lower horizontal portion 124B of the fluorine-free silicate glass layer 124 vertically abuts a bottom surface of the metal line 28. An upper sidewall portion 124C of the fluorine-free silicate glass layer 124 laterally abuts and surrounds the metal line 28. A top surface of the metal line 28 is coplanar with a top surface of an upper horizontal portion 124D of the fluorine-free silicate glass layer 124. The lower sidewall portion 124A, the lower horizontal portion 124B, the upper sidewall portion 124C, and the upper horizontal portion 124D collectively constitute the fluorine-free silicate glass layer 124. The terminal dielectric layer 29 separates the FSG layer 22 from the upper horizontal portion 124D of the fluorine-free silicate glass layer 124. The metal via 26 vertically abuts a top surface of the underlying metal line 18 and a bottom surface of the metal line 28, and is laterally surrounded by the dielectric cap layer 21.

The third exemplary metal interconnect structure provides good adhesion strength between a metal line 28 and a metal via 26 and an assembly of dielectric layers, which comprise the FSG layer 22, the terminal dielectric layer 29, and the fluorine-free silicate glass layer 124, as well as reduced capacitive coupling between metallic structures in the same manner as the first exemplary metal interconnect structure.

Figure 18:
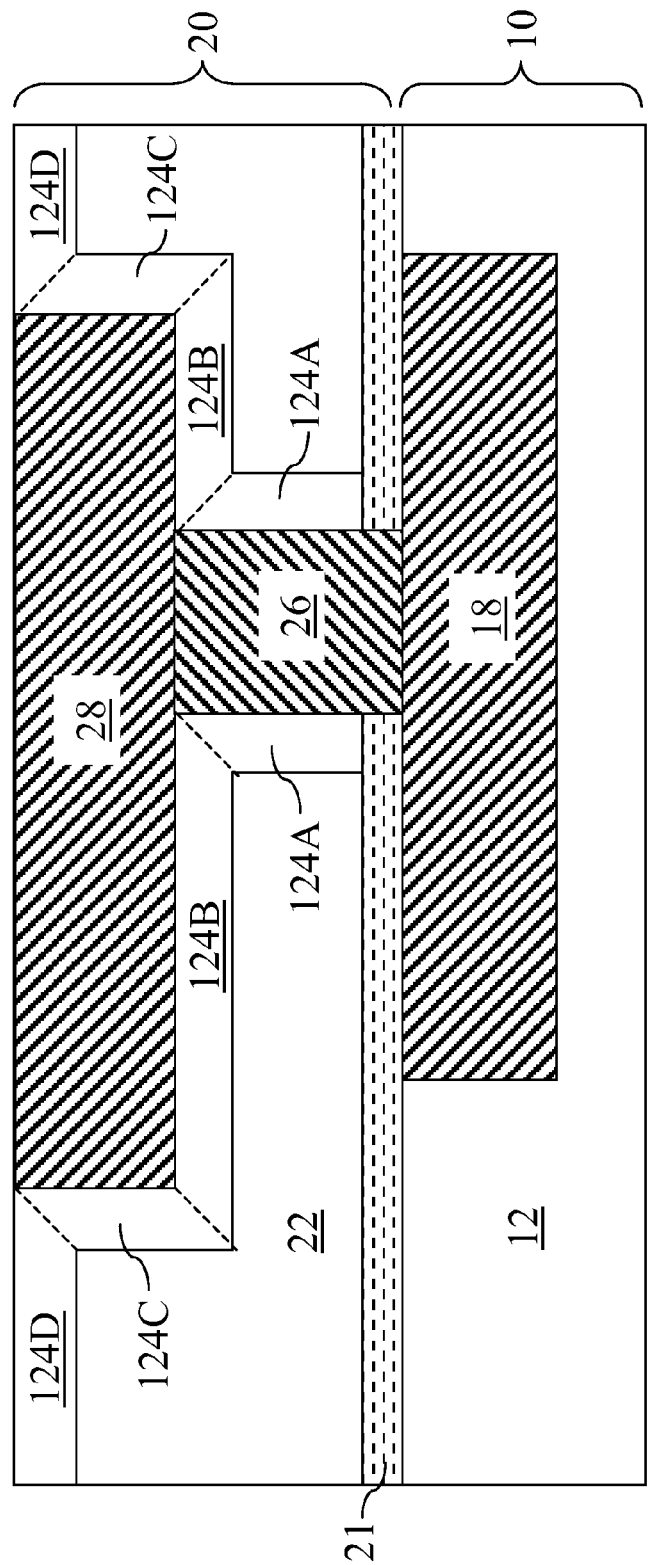
FIG. 18 is a vertical cross-sectional view of a fourth exemplary semiconductor structure according to the present invention.

Referring to FIG. 18, a fourth exemplary metal interconnect structure is formed in the same manner as in the third embodiment of the present invention, while omitting the formation of the terminal dielectric layer 29. Thus, the upper horizontal portion 124D of the fluorine-free silicate glass layer 124 is formed directly on a top surface of the FSG layer 22.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a metal interconnect structure comprising:

forming an underlying metal line embedded in an underlying dielectric layer on a substrate;

forming a dielectric cap layer directly on said underlying metal line and said underlying dielectric layer;

forming a fluorosilicate glass (FSG) layer directly on said dielectric cap layer, wherein said FSG layer has a first fluorine atomic concentration;

patterning a line trough and a via cavity within said FSG layer;

forming a single continuous fluorine depleted silicate glass layer, having an upper horizontal portion overlying a topmost horizontal surface of said FSG layer, and having a second fluorine atomic concentration on said fluorosilicate glass (FSG) layer, wherein said second fluorine atomic concentration is about 10% of, or less than 10% of, said first fluorine atomic concentration;

applying a photoresist over said single continuous fluorine depleted silicate glass layer, wherein a portion of said single continuous fluorine depleted silicate glass layer within said via cavity is exposed;

removing said exposed portion of said fluorine depleted silicate glass layer and a portion of said dielectric cap layer underneath said exposed portion of said fluorine depleted silicate glass layer employing said photoresist as an etch mask, wherein a top surface of said underlying metal line is exposed; and forming a metal line and a metal via directly on said fluorine depleted silicate glass layer, wherein said metal line and said metal via are spaced from said FSG layer by said fluorine depleted silicate glass layer, and said metal via is in direct contact with said underlying metal line.

2. The method of claim 1, wherein said fluorine depleted silicate glass layer is formed by treating said FSG layer at said line trough and at said via cavity with plasma, wherein exposed portions of said FSG layer is converted into said fluorine depleted silicate glass layer by losing fluorine.

3. The method of claim 1, wherein said fluorine depleted silicate glass layer is formed by deposition of a fluorine-free silicate glass layer over said FSG layer and within said line trough and said via cavity.

4. The method of claim 1, further comprising forming a terminal dielectric layer comprising a dielectric material directly on said FSG layer prior to said patterning of said line trough and said via cavity.

5. The method of claim 1, wherein a top surface of said fluorine depleted silicate glass layer is coplanar with a top surface of said metal line.

6. The method of claim 1, wherein said forming said fluorosilicate glass layer comprises a deposition process or spin-on coating.

7. The method of claim 6, wherein said forming said fluorosilicate glass layer comprises a chemical vapor deposition process.

8. The method of claim 7, wherein said chemical vapor deposition is conformal and said fluorine-free silicate glass layer includes vertical portions and horizontal portions of a same thickness.

9. The method of claim 8, wherein said fluorine-free silicate glass layer has a thickness from about 5 nm to about 300 nm.

10. The method of claim 9, wherein said fluorine-free silicate glass layer has a thickness from about 20 nm to about 150 nm.

11. The method of claim 1, wherein said fluorine-free silicate glass layer comprises undoped silicate glass or silicate glass that is doped with at least one dopant selected from the group consisting of boron, phosphorous and a combination thereof.

* * * * *